US008123531B2

(12) United States Patent
Tanaka (10) Patent No.: US 8,123,531 B2
(45) Date of Patent: Feb. 28, 2012

(54) CARD HOLDER AND BROADCAST RECEIVING APPARATUS HAVING CARD HOLDER

(75) Inventor: Takafumi Tanaka, Katsushika (JP)

(73) Assignee: Kabushiki Kaisha Toshiba (JP)

( * ) Notice: Subject to any disclaimer, the term of this patent is extended or adjusted under 35 U.S.C. 154(b) by 3 days.

(21) Appl. No.: 12/857,501

(22) Filed: Aug. 16, 2010

(65) Prior Publication Data

US 2011/0059630 A1   Mar. 10, 2011

(30) Foreign Application Priority Data

Sep. 10, 2009   (JP) ................................. 2009-209087

(51) Int. Cl.
*H01R 12/00* (2006.01)
(52) U.S. Cl. .......................................................... 439/74
(58) Field of Classification Search .................... 439/65, 439/74; 361/790, 735
See application file for complete search history.

(56) References Cited

U.S. PATENT DOCUMENTS

| | | | | |
|---|---|---|---|---|
| 7,511,967 | B2* | 3/2009 | Loda ............................. | 361/790 |
| 7,572,154 | B2* | 8/2009 | Ichio et al. .................... | 439/701 |
| 7,606,959 | B2* | 10/2009 | Yao et al. ...................... | 710/301 |
| 7,670,146 | B2* | 3/2010 | Jow ................................ | 439/65 |
| 7,690,927 | B1* | 4/2010 | Kerrigan et al. ............... | 439/74 |
| 7,748,992 | B1* | 7/2010 | Wooley et al. ................. | 439/74 |
| 7,929,310 | B2* | 4/2011 | Belady et al. ................. | 361/735 |
| 7,991,934 | B2* | 8/2011 | Yao et al. ...................... | 710/301 |
| 2002/0034068 | A1* | 3/2002 | Weber et al. .................. | 361/790 |
| 2002/0075662 | A1* | 6/2002 | Oh-Yang ....................... | 361/790 |
| 2004/0166704 | A1* | 8/2004 | Perugini et al. ................ | 439/74 |
| 2006/0240688 | A1* | 10/2006 | Perugini et al. ................ | 439/74 |
| 2007/0015381 | A1* | 1/2007 | Muff et al. ..................... | 439/74 |
| 2007/0297158 | A1* | 12/2007 | Lee ................................ | 361/790 |
| 2008/0045044 | A1* | 2/2008 | Yi ................................... | 439/65 |
| 2009/0093140 | A1* | 4/2009 | Fogg et al. ..................... | 439/65 |
| 2009/0186494 | A1* | 7/2009 | Bell et al. ...................... | 439/65 |
| 2011/0059630 | A1* | 3/2011 | Tanaka .......................... | 439/65 |

FOREIGN PATENT DOCUMENTS

JP   04-93099 A   3/1992

(Continued)

OTHER PUBLICATIONS

Notification of Reasons for Rejection mailed by the Japanese Patent Office on Feb. 22, 2011 in the corresponding Japanese patent application No. 2011-013684 in 5 pages.

(Continued)

*Primary Examiner* — Ross Gushi
(74) *Attorney, Agent, or Firm* — Knobbe, Martens, Olson & Bear (57) ABSTRACT

According to one embodiment, a card holder includes a first printed wiring board, a second printed wiring board disposed to face the first printed wiring board, a third printed wiring board disposed to face second printed wiring board, a first stacking connector disposed between the first printed wiring board and the second printed wiring board to electrically connect and to physically fix the first printed wiring board and the second printed wiring board, and a second stacking connector disposed between the second printed wiring board and the third printed wiring board to electrically connect and to physically fix the second printed wiring board and the third printed wiring board. The first stacking connector and the second stacking connector the first stacking connector and the second stacking connector are structurally incompatible with each other.

5 Claims, 6 Drawing Sheets

FOREIGN PATENT DOCUMENTS

| | | |
|---|---|---|
| JP | H08-096903 | 4/1996 |
| JP | 2000-031617 | 1/2000 |
| JP | 2000-31617 A | 1/2000 |
| JP | 2006-303167 | 11/2006 |
| JP | 2006-303167 A | 11/2006 |
| WO | WO 2009/031220 | 3/2009 |

OTHER PUBLICATIONS

Notification of Reasons for Rejection mailed by the Japanese Patent Office on Oct. 26, 2010 in the corresponding Japanese patent application No. 2009-209087.

* cited by examiner

CARD HOLDER AND BROADCAST RECEIVING APPARATUS HAVING CARD HOLDER

CROSS-REFERENCE TO RELATED APPLICATIONS

This application claims priority from Japanese Patent Application No. 2009-209087 filed on Sep. 10, 2009, the entire content of which is incorporated herein by reference.

BACKGROUND

1. Field

One embodiment of the invention relates to a card holder and a broadcast receiving apparatus having the card holder.

2. Description of the Related Art

A related art electronic device includes a plurality of printed wiring boards which are interconnected to form an electronic circuit as a whole. The electronic circuit is divided into a plurality of functional blocks, and each of the functional blocks is mounted on a corresponding one of the printed wiring boards.

When interconnecting the printed wiring boards, the printed wiring boards need to be connected in the right order, which otherwise would cause a conflict of output signals between the printed wiring boards. In order to avoid such a situation, for example, JP-A-2006-303167 describes a technique that enables signal output only when it is determined, on the basis of identification information of connectors which connect the printed wiring boards and stacking position information of the respective boards, that the printed wiring boards are connected in a correct manner.

As an example of the electronic device described above, there is a card holder adapted to receive and to hold BS-Conditional Access Systems (B-CAS) cards. B-CAS cards are used in a television set or the like to receive terrestrial digital broadcast signals. In the B-CAS card holder, for example, six printed wiring boards are interconnected via stacking connectors.

With a view to showing the order of assembling, numbers indicating the order may be marked on the respective printed wiring boards. However, since the assembling work is manually carried out, this does not suffice to completely prevent an oversight.

BRIEF DESCRIPTION OF THE SEVERAL VIEWS OF THE DRAWINGS

A general architecture that implements the various features of the invention will now be described with reference to the drawings. The drawings and the associated descriptions are provided to illustrate embodiments of the invention and not to limit the scope of the invention.

DETAILED DESCRIPTION

Various embodiments according to the invention will be described hereinafter with reference to the accompanying drawings. In general, according to one embodiment of the invention, a card holder includes a first printed wiring board, a second printed wiring board disposed to face the first printed wiring board, a third printed wiring board disposed to face second printed wiring board, a first stacking connector disposed between the first printed wiring board and the second printed wiring board to electrically connect and to physically fix the first printed wiring board and the second printed wiring board, and a second stacking connector disposed between the second printed wiring board and the third printed wiring board to electrically connect and to physically fix the second printed wiring board and the third printed wiring board. The first stacking connector and the second stacking connector the first stacking connector and the second stacking connector are structurally incompatible with each other.

An electronic device according to the following embodiments includes a card holder 11 adapted to be used in a television set. The card holder 11 receives and holds, for example, BS-Conditional Access Systems (B-CAS) card. B-CAS cards are used in a television set or the like to receive terrestrial digital broadcast signals and to watch broadcasted programs. The television set has a tuner which receives the terrestrial digital broadcast signals and enables selection of channels. The card holder 11 is installed in, for example, a recording device of the television set. A maximum of, for example, six different kinds of B-CAS cards can be inserted and held in the card holder 11.

Each of the B-CAS cards stores key information for decoding the broadcast signals, which have been encoded by B-CAS method, in a playable format. There are several kinds of B-CAS cards. For example, a "red card" supports a terrestrial/BS/110-degree CS digital receiver, a "blue card" supports a terrestrial digital receiver, and an "orange card" supports a cable television set-top box. Various broadcast programs can be received by inserting the card that is compliant with the receiver into the card holder 11.

Figure 1:
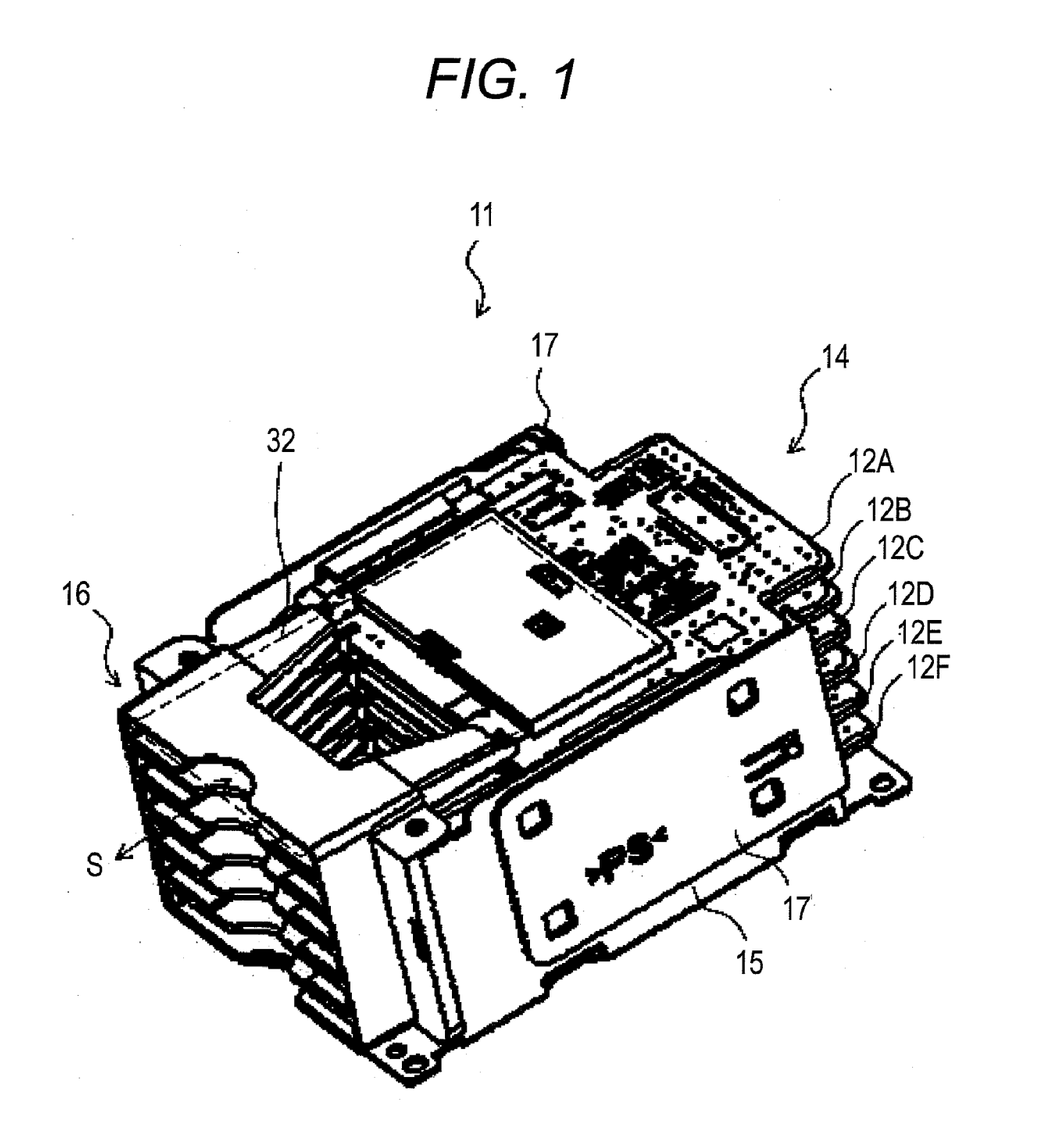
FIG. 1 is an exemplary perspective view of a card holder according to a first embodiment of the invention.

An overall configuration of the card holder 11 will be described with reference to FIG. 1. FIG. 1 is an exemplary perspective view of the card holder 11 according to one embodiment of the invention.

As shown in FIG. 1, the card holder 11 includes a printed wiring board module 14 having first to sixth printed wiring boards 12A to 12F, a base 15 which surrounds a bottom and respective sides of the printed wiring board module 14, a guide 16 which is attached to a front of the printed wiring board module 14, and a pair of supports 17 which fixes the first to sixth printed wiring boards 12A to 12F with respect to the base 15. A card 32 is inserted from a corresponding slot 36 of the guide 16 along an insertion direction S (see also FIG. 2).

Figure 2:
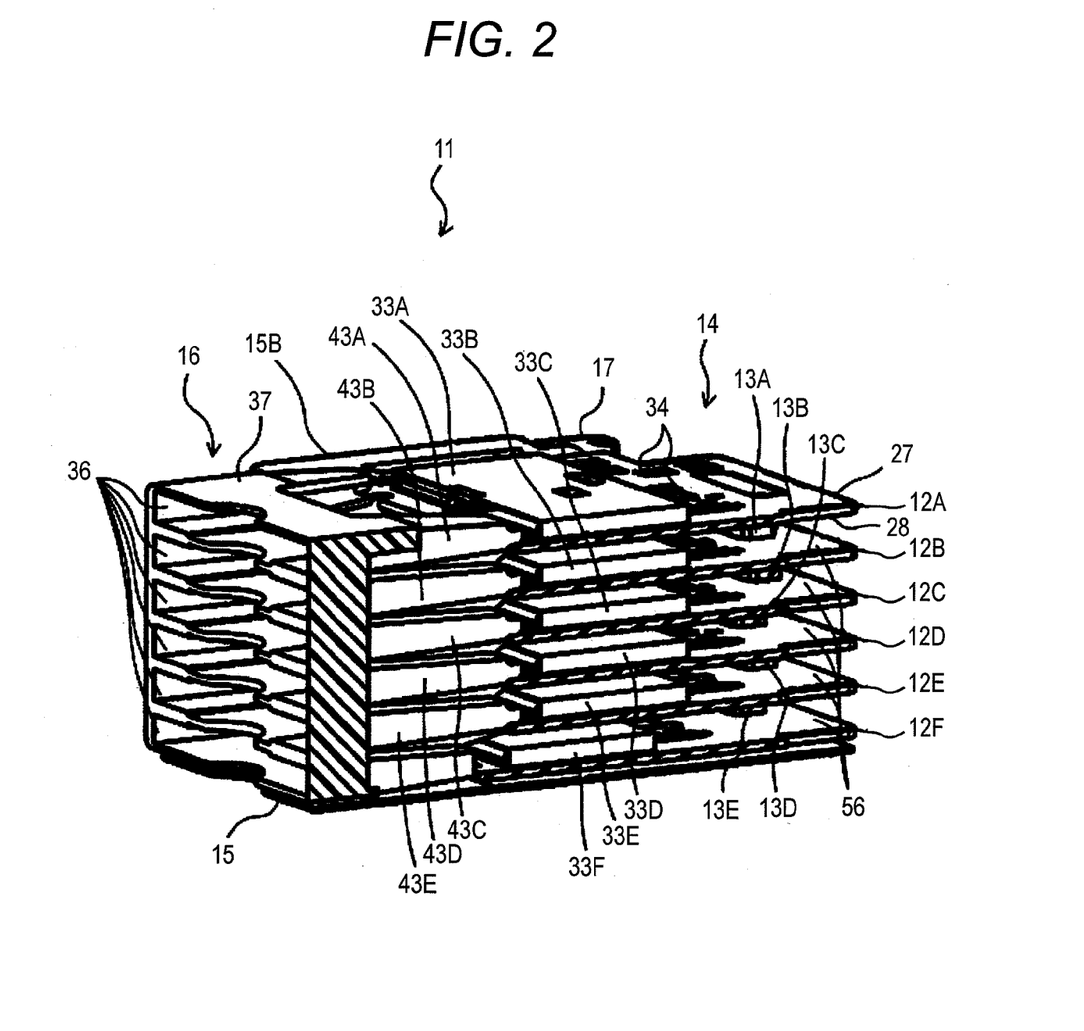
FIG. 2 is an exemplary sectional view of the card holder taken along a longitudinal direction of the card holder of FIG. 1.

Next, an internal structure of the card holder 11 will be described with reference to FIG. 2. FIG. 2 is an exemplary sectional view of the card holder 11 of FIG. 1 taken in the longitudinal direction of the card holder 11.

As shown in FIG. 2, each of the first to sixth printed wiring boards 12A to 12F has an upper surface as a first surface 27 and a lower surface as a second surface 28. On the first surface 27 of each the first to sixth printed wiring boards 12A to 12F, a corresponding one of first to sixth card connectors 33A to 33F and a plurality of circuit components 34 are mounted. Each of the first to sixth card connectors 33A to 33F has a shape of a flat and low-profile box which is opened at a front facing toward the guide 16. The card 32 is inserted into the corresponding one of the first to sixth card connectors 33A to 33F (see FIG. 1).

Between the first printed wiring board 12A and the second printed wiring board 12B, a first stacking connector 13A is disposed to electrically connect and to physically fix the first printed wiring board 12A and the second printed wiring board 12B. Between the second printed wiring board 12B and the third printed wiring board 12C, a second stacking connector 13B is disposed to electrically connect and to physically fix the second printed wiring board 12B and the third printed wiring board 12C. Between the third printed wiring board 12C and the fourth printed wiring board 12D, a third stacking connector 13C is disposed to electrically connect and to physically fix the third printed wiring board 12C and the fourth printed wiring board 12D. Between the fourth printed wiring board 12D and the fifth printed wiring board 12E, a fourth stacking connector 13D is disposed to electrically connect and to physically fix the fourth printed wiring board 12D and the fifth printed wiring board 12E. Between the fifth printed wiring board 12E and the sixth printed wiring board 12F, a fifth stacking connector 13E is disposed to electrically connect and to physically fix between the fifth printed wiring board 12E and the sixth printed wiring board 12F.

That is, circuits provided on the first to sixth printed wiring boards 12A to 12F are electrically connected to each other via the first to fifth stacking connectors 13A to 13E, which are disposed between the adjacent ones of the first to sixth printed wiring boards 12A to 12F, respectively.

The first to fifth stacking connectors 13A to 13E have different numbers of terminals.

The circuit provided on the sixth printed wiring board 12F is designed to be electrically coupled to the fifth to first printed wiring boards 12E to 12A. Similarly, the circuit provided on the fifth printed wiring board 12E is designed to be electrically coupled to the fourth to first printed wiring boards 12D to 12A. In this manner, the circuit provided on each of the printed wiring boards is designed to be electrically coupled to all the printed wiring boards arranged above. That is, the number of electrically coupled circuits increases as the printed wiring boards are stacked in the order of the sixth printed wiring board 12F to the first printed wiring board 12A. Therefore, unless the first to sixth printed wiring boards 12A to 12F are interconnected in the correct order, the card holder 11 cannot properly perform its function.

Figure 3:
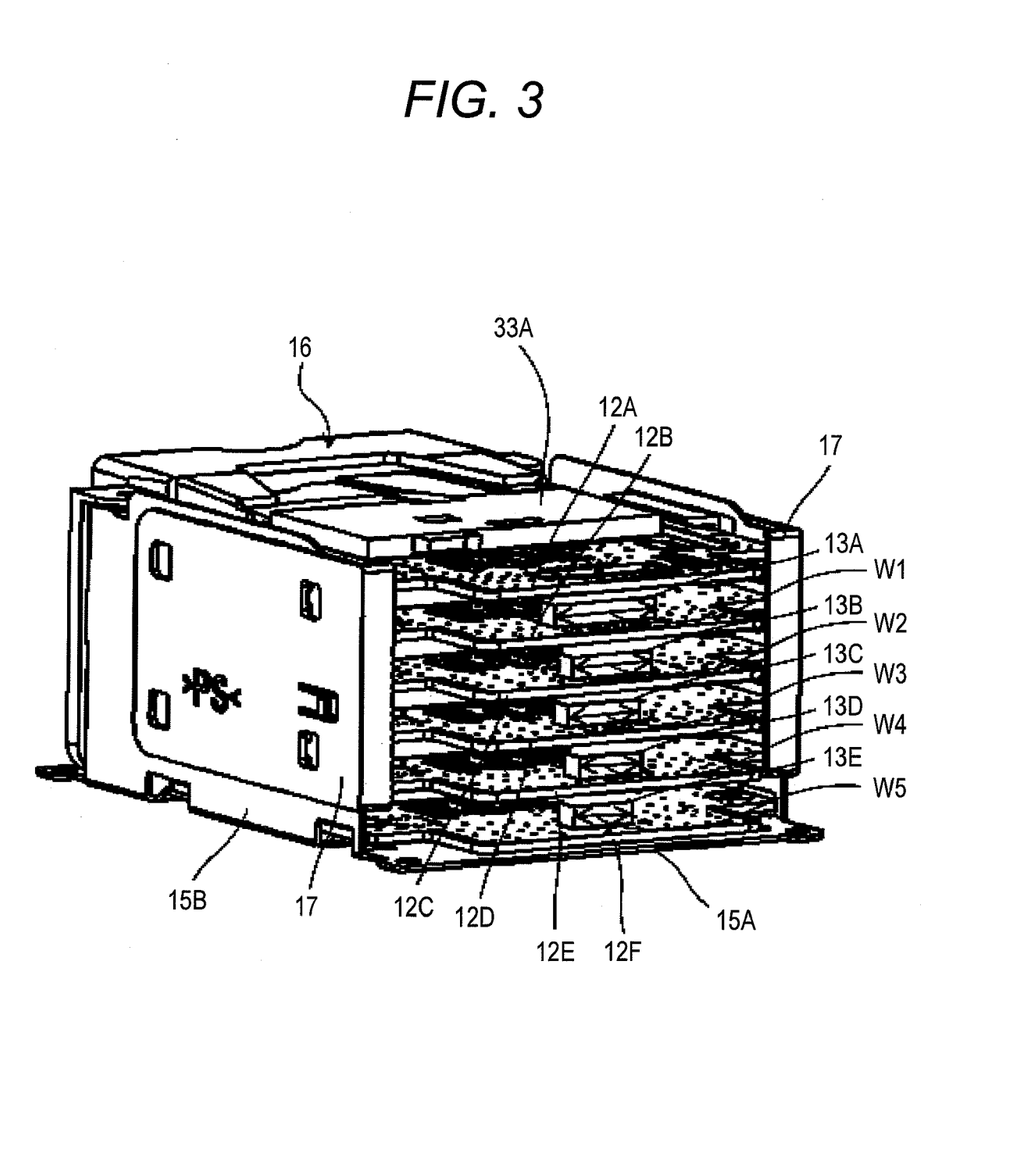
FIG. 3 is an exemplary rear perspective view of the card holder of FIG. 1.

Next, the first to fifth stacking connectors 13A to 13E will be described with reference to FIG. 3. FIG. 3 is an exemplary rear perspective view of the card holder 11 shown in FIG. 1.

As shown in FIG. 3, the widths of the first to fifth stacking connectors 13A to 13E will be denoted as W1 to W5, respectively. The width W1 of the first stacking connector 13A is the largest, and the widths W2 to W5 are reduced sequentially in this order. That is, among the first to fifth stacking connectors 13A to 13E, there are no connectors that have the same width.

On the second surface 28 of each of the first to fifth printed wiring boards 12A to 12E, a concave connector that fits to the corresponding one of the first to fifth stacking connectors 13A to 13E is mounted. The printed wiring boards 12A to 12F are interconnected by fitting each of the concave connectors to the corresponding one of the first to fifth stacking connectors 13A to 13E. Therefore, the order of the first to sixth printed wiring boards 12A to 12F to be held in the card holder 11 cannot be changed.

That is, the first stacking connector 13A is used exclusively for the connection between the first printed wiring board 12A and the second printed wiring board 12B. The second stacking connector 13B is used exclusively for the connection between the second printed wiring board 12B and the third printed wiring board 12C. The third stacking connector 13C is used exclusively for the connection between the third printed wiring board 12C and the fourth printed wiring board 12D. The fourth stacking connector 13D is used exclusively for the connection between the fourth printed wiring board 12D and the fifth printed wiring board 12E.

The fifth stacking connector 13E is used exclusively for the connection between the fifth printed wiring board 12E and the sixth printed wiring board 12F. Accordingly, the positional relationship of the first to sixth printed wiring boards 12A to 12F is fixed and cannot be changed.

Each of the first to fifth stacking connectors 13A to 13E is arranged at a second position 56 which is in a vicinity of perimeters of the adjacent ones of the printed wiring boards 12A to 12F. This second position 56 is on a side opposite to a first position 55, which will be described later, across the center of each of the first to sixth printed wiring boards 12A to 12F. That is, the first to fifth stacking connectors 13A to 13E are provided in the vicinity of the perimeters of the first to sixth printed wiring boards 12A to 12F, not at the centers thereof. Therefore, when assembling the card holder 11, the stacking connectors 13A to 13E are easily recognizable, which improves working efficiency when connecting the printed wiring boards 12A to 12F with the stacking connectors 13A to 13E.

Figure 4:
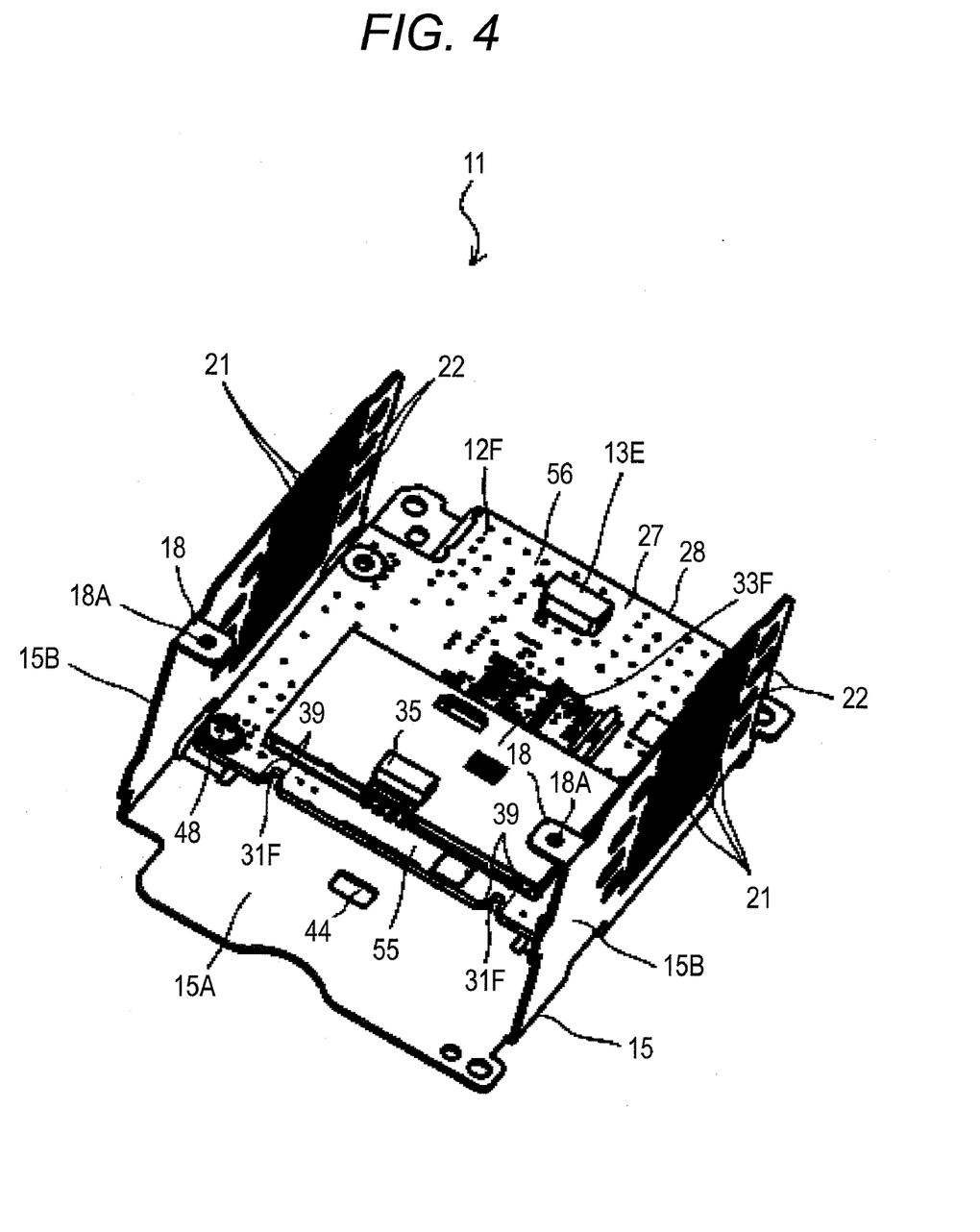
FIG. 4 is an exemplary perspective view illustrating a base and a sixth printed wiring board of the card holder of FIG. 1.

Next, respective parts of the card holder 11 will be described with reference to FIGS. 4 to 6. First, with reference to FIG. 4, a structure of the base 15 will be described. FIG. 4 is an exemplary perspective view illustrating the base 15 and the sixth printed wiring board 12F.

As shown in FIG. 4, the base 15 is formed to have a U-shaped cross section by sheet-metal working. The base 15 has a bottom wall 15A, side walls 15B which upwardly extend from opposite sides of the bottom wall 15A, respectively, and receiving protrusions 18 which are provided at front upper ends of the respective side walls 15B. Each of the side walls 15B is formed with a plurality of laterally elongated through holes 21 and a plurality of rectangular openings 22. Each of the receiving protrusions 18 is formed with a screw hole 18A to fix a screw inserted into an insertion hole 45 of a corresponding attaching portion 38, which will be described later.

On an upper side of each of the each of the second to sixth card connectors 33B to 33F of the second to the sixth printed wiring boards 12B to 12F, a height adjusting piece 35 is adhered as shown in FIG. 4. The height adjusting piece 35 is provided at the first position 55 which is in a vicinity of the perimeter of the corresponding one of the printed wiring boards 12A to 12E. The sum of a heightwise dimension of the height adjusting piece 35 and a heightwise dimension of corresponding one of the card connectors 33B to 33F is substantially equal to a heightwise dimension of corresponding one of the stacking connectors 13A to 13E. Therefore, when stacking the first to sixth printed wiring boards 12A to 12F one above the other so as to face each other, the first to fifth printed wiring boards 12A to 12E are prevented from being inclined downwardly from the position where the stacking connectors 13A to 13E are provided. The height adjusting piece 35 may be disposed in a different manner between the adjacent ones of the printed wiring boards 12A to 12E. For example, the height adjusting piece 35 may be provided directly on the second surface 28 of the corresponding one of the first to fifth printed wiring boards 12A to 12E disposed above. In this embodiment, the height adjusting piece 35 is disposed on the upper side of each of the second to sixth card connectors 33B to 33F. Therefore, a larger mounting space can be provided on each of the second to the fifth printed wiring boards 12B to 12E as compared with a case in which the height adjusting piece 35 is disposed at a location other than the second to sixth card connectors 33B to 33F.

Next, a structure of the supports 17 will be described with reference to FIG. 5. FIG. 5 is an exemplary perspective view illustrating how the supports 17 are attached after mounting the first to fifth printed wiring boards 12a to 12E on the base 15 of the card holder 11.

Figure 5:
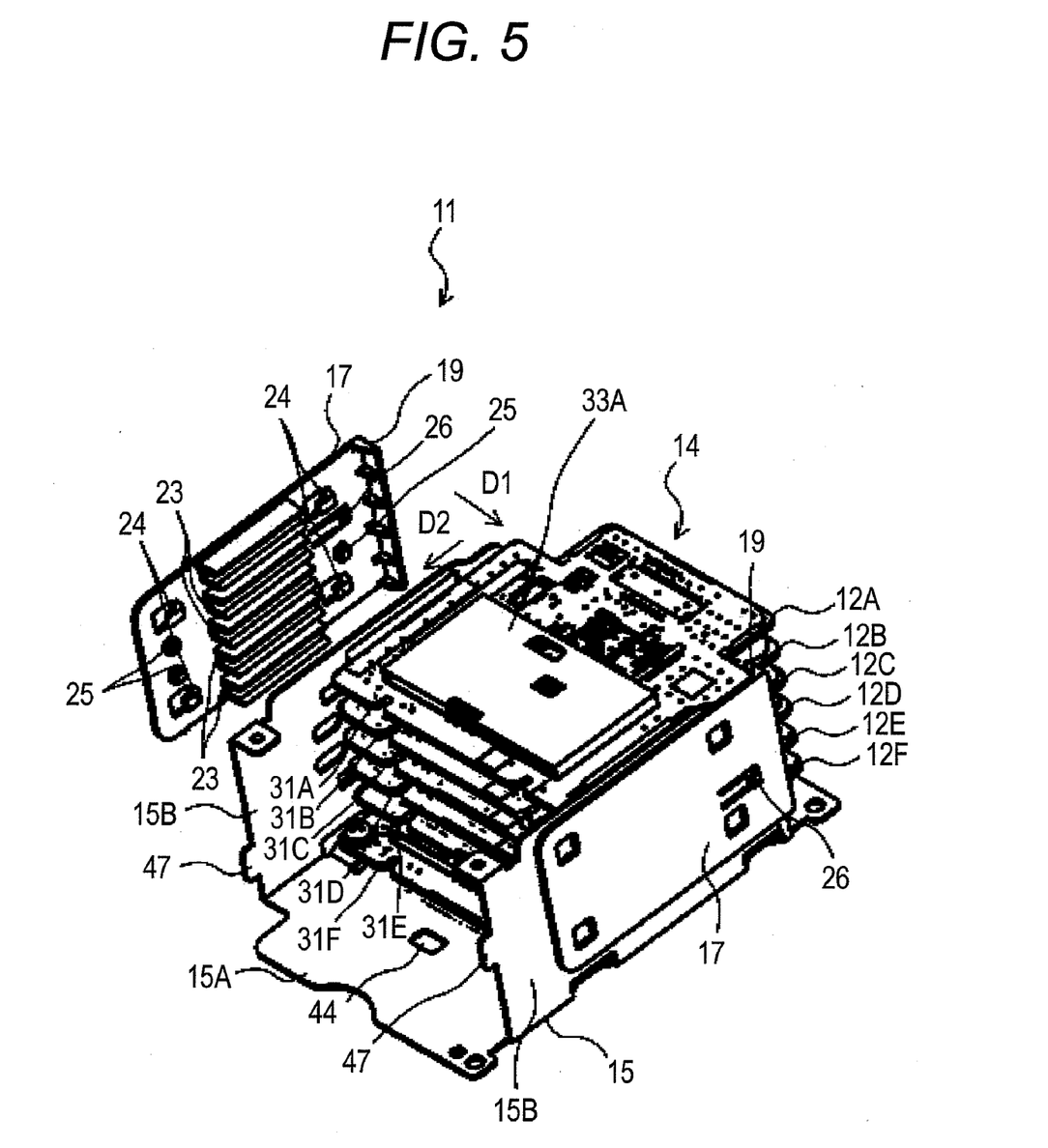
FIG. 5 is an exemplary perspective view illustrating how a support is attached after mounting first to fifth printed wiring boards on the base of FIG. 4.

As shown in FIG. 5, each of the supports 17 has a shape of a rectangular plate, and includes five brackets 23 which protrude toward the first to fifth printed wiring boards 12A to 12E, respectively. Each of the brackets 23 has a U shaped cross section, and can interpose and hold a corresponding one of the first to fifth printed wiring boards 12A to 12E from above and below. Each of the supports 17 further includes four claws 24 which are engageable with some of the openings 22 of the corresponding side wall 15B, three positioning pins 25 which are engageable with some of the openings 22 of the corresponding side wall 15B, and a hook 26 which is engageable with one of the openings 22 of the corresponding side wall 15B. In order to remove the support 17 from the base 15, the hook 26 is lifted up to disengage from the base 15, and the support 17 is slid in a direction in which the claws 24 disengage. In this way, the supports 17 can be easily removed from the base 15.

Each of the supports 17 has an end wall 19. The end wall 19 abuts the rear end portions of the first to fifth printed wiring boards 12A to 12E to position the first to fifth printed wiring boards 12A to 12E.

Next, a structure of the guide 16 will be described with reference to FIG. 6. FIG. 6 is an exemplary perspective view illustrating a step subsequent to the step shown in FIG. 5.

Figure 6:
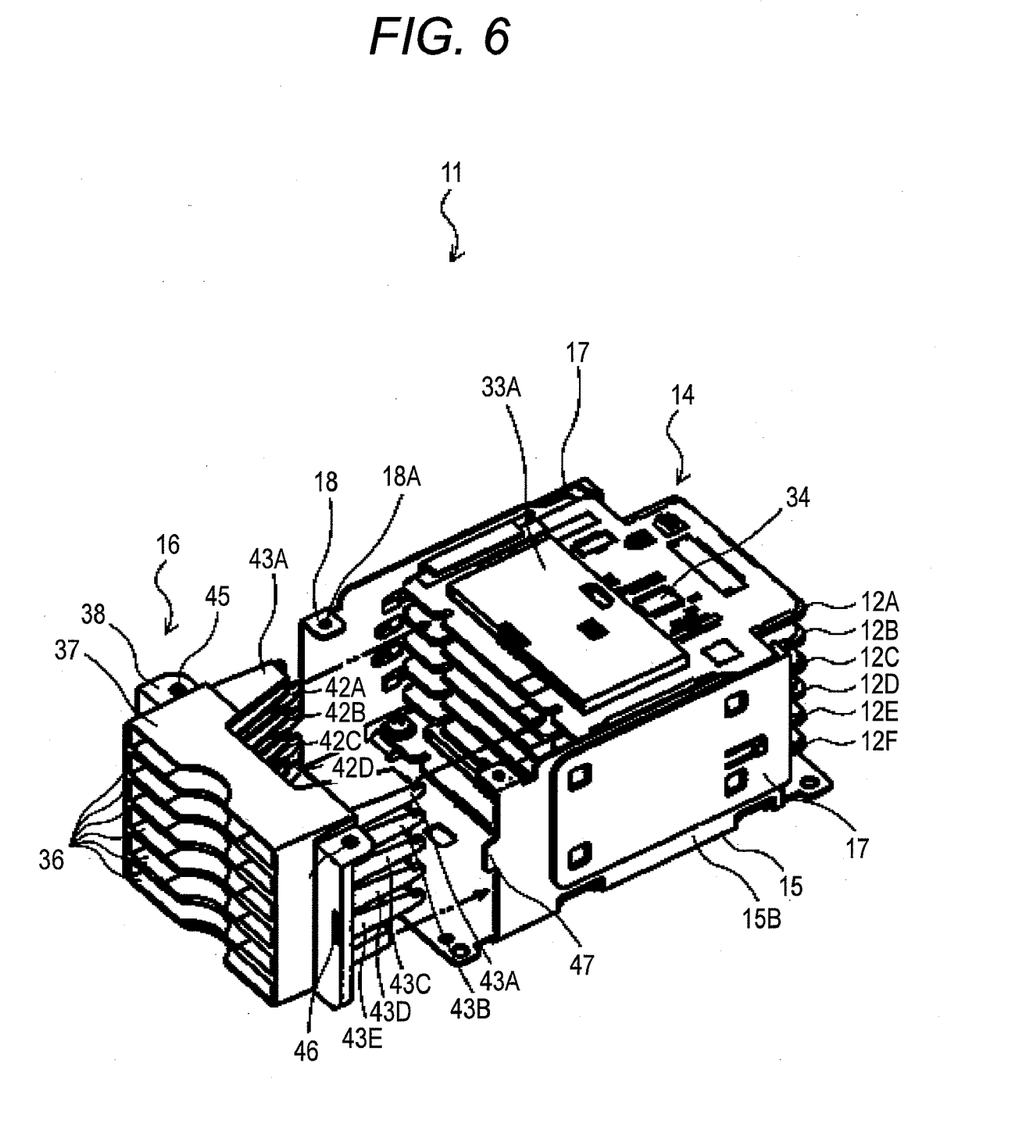
FIG. 6 is an exemplary perspective view illustrating an assembling step subsequent to the step illustrated in FIG. 5.

As shown in FIG. 6, the guide 16 is provided separately from the first to sixth printed wiring boards 12A to 12F, and guides the cards 32 toward the first to sixth card connectors 33A to 33F. The guide 16 is formed as a one-piece structure made of a synthetic resin. The guide 16 is formed with a total of six rectangular slots 36 which correspond to the first to sixth card connectors 33A to 33F, respectively. The guide 16 includes a frame 37 which defines a periphery of each of the slots 36, attaching portions 38 provided on respective sides of the frame 37, a hook provided at a lower end of the frame 37, first to sixth projections 42A to 42F which protrude from the frame 37 toward the first to sixth card connectors 33A to 33F, respectively, and first to fifth contact protrusions 43A to 43E which protrude from the frame 37 so as to come into contact with the first to fifth printed wiring boards 12A to 12E, respectively. The hook adapted to be inserted into a locking hole 44 in the bottom wall 15A of the base 15. As shown in FIG. 1, each of the attaching portions 38 formed with the insertion hole 45 into which a screw is inserted to fix the guide 16 to the base 15.

The first to sixth projections 42A to 42F protrude toward the first to sixth printed wiring boards 12A to 12F in pairs, respectively. The first to sixth projections 42A to 42F are inserted into the first to sixth grooves 31A to 31F of the first to sixth printed wiring boards 12A to 12F such that each of the first to sixth projections 42A to 42F slightly project from the first surfaces 27 of the corresponding one of the first to sixth printed wiring boards 12A to 12F. The projecting amount of each of the first to sixth projections 42A to 42F from the first surface 27 is, for example, about 0.1 mm to 0.4 mm.

The first to sixth projections 42A to 42F can be inserted and removed along the insertion direction S of the card 32 with respect to the first to sixth grooves 31A to 31F. The first to sixth projections 42A to 42F are arranged to contact a lower surface of the corresponding card 32 and to guide the cards 32 toward the first to sixth card connectors 33A to 33F from below.

Further, the first to sixth projections 42A to 42F position the corresponding one of the first to sixth printed wiring boards 12A to 12F in the direction in which the first to sixth printed wiring boards 12A to 12F extend, i.e., in the horizontal direction. The first to sixth projections 42A to 42F extend in a direction parallel to the first to sixth printed wiring boards 12A to 12F, respectively. The first to sixth projections 42A to 42F are arranged on an inner side than the first to fifth contact protrusions 43A to 43E.

As shown in FIG. 2, the first contact protrusion 43A comes into contact with the first surface 27 of the first printed wiring board 12A. The second contact protrusion 43B comes into contact with the first surface 27 of the second printed wiring board 12B. The third contact protrusion 43C comes into contact with the first surface 27 of the third printed wiring board 12C. The fourth contact protrusion 43D comes into contact with the first surface 27 of the fourth printed wiring board 12D. The fifth contact protrusion 43E comes into contact with the first surface 27 of the fifth printed wiring board 12E.

As shown in FIG. 5, the first to sixth printed wiring boards 12A to 12F are formed with pairs of the first to sixth grooves 31A to 31F into which the first to sixth projections 42A to 42F of the guide 16 are inserted, respectively. The first to sixth grooves 31A to 31F are provided at the ends of the printed wiring boards 12A to 12F opposed to the guide 16 so as to penetrate through the printed wiring boards 12A to 12F in the thickness direction thereof. The first to sixth grooves 31A to 31F extend from the end faces of the printed wiring boards 12A to 12F toward the first to sixth card connectors 33A to 33F, i.e., in the insertion direction S of the card 32.

As shown in FIG. 4, each of the first to sixth grooves 31A to 31F has near end portions 39 provided at the end opposed to the guide 16. The near end portions 39 forms tapered faces, a space between which is widened toward the frame 37 of the guide 16. The near end portions 39 makes it possible to smoothly guide the insertion operation of the first to sixth projections 42A to 42F, which will be described below, into the first to sixth grooves 31A to 31F.

Next, an exemplary process of assembling the card holder 11 will be described with reference to FIGS. 4 to 6. As shown in FIG. 4, first, the sixth printed wiring board 12F is fixed to the bottom wall 15A of the base 15 by, for example, screws 48. Then, the fifth printed wiring board 12E is fixed to the sixth printed wiring board 12F using the fifth stacking connector 13E. The fourth printed wiring board 12D is fixed to the fifth printed wiring board 12E using the fourth stacking connector 13D. The third printed wiring board 12C is fixed to the fourth printed wiring board 12D using the third stacking connector 13C. The second printed wiring board 12B is fixed to the third printed wiring board 12C using the second stacking connector 13B. Then, the first printed wiring board 12A is fixed to the second printed wiring board 12B using the first stacking connector 13A. In this state, the first to sixth printed wiring boards 12A to 12F are temporarily fixed by the stacking connectors 13A to 13E.

In this embodiment, the stacking connectors 13A to 13E are provided such that the widths W1 to W5 are reduced sequentially in this order. Therefore, a pair of connectable printed wiring boards among the first to sixth printed wiring boards 12A to 12F is fixed for each of the stacking connectors 13A to 13E. Accordingly, the order of the first to sixth printed wiring boards 12A to 12F cannot be changed.

Next, the first support 17 is attached to one of the side walls 15B of the base 15 and to the first to sixth printed wiring boards 12A to 12F, and the second support 17 is attached to the other side wall 15B of the base 15 and to the first to sixth printed wiring boards 12A to 12F. When attaching these supports 17, as shown in FIG. 5, first, the support 17 is moved in a direction D1 toward the side wall 15B of the base 15 to insert the brackets 23 into the respective through holes 21 and to insert the claws 24, the positioning pins 25 and the hook 26 into the respective openings 22. Subsequently, the support 17 is forwardly moved in a direction D2 to hook each of the claws 24 on a circumferential edge of the corresponding through hole 21, whereby the hook 26 is dropped into the corresponding opening 22 and is locked. Each of the first to sixth printed wiring boards 12A to 12F is held by the corresponding bracket 23 of the support 17 from both sides.

As shown in FIG. 6, the guide 16 is moved along the insertion direction S of the card 32 to fix the guide 16 with respect to the base 15 and the first to sixth printed wiring boards 12A to 12F.

When fixing the guide 16, the first to sixth projections 42A to 42F of the guide 16 are inserted into the first to sixth grooves 31A to 31F of the first to sixth printed wiring boards 12A to 12F, respectively. In addition, the first to fifth contact protrusions 43A to 43E of the guide 16 come into contact with the first surfaces 27 of the first to fifth printed wiring boards 12A to 12E, respectively. Further, positioning protrusions 47 protruding from the side walls 15B of the base 15 are inserted into the fixing holes 46 in the attaching portions 38 of the guide 16, whereby the card holder 11 is assembled as shown in FIG. 1. In this state, the hook of the guide 16 is inserted into the locking hole 44 of the base 15 and is locked. Then, screws are fixed into the insertion holes 45 of the attaching portions 38 and the screw holes 18A of the receiving protrusions 18, respectively, whereby the assembling of the card holder 11 is completed.

According to the card holder 11 having the configuration described above, the first to fifth stacking connectors 13A to 13E have different widths W1 to W5. Therefore, an error in the assembling order of the first to sixth printed wiring boards 12A to 12F can be prevented.

That is, it is possible to correctly arrange the first to sixth printed wiring boards 12A to 12F on which the first to sixth card connectors 33A to 33F for inserting the cards 32 are mounted, respectively. Therefore, as for the card holder 11 into which a plurality of kinds of cards 32 are inserted, the first to sixth card connectors 33A to 33F corresponding to each of the cards 32 are correctly arranged. Thus, reliability of the manufacture of the card holder is improved.

In addition, while the shapes of the first to fifth stacking connectors 13A to 13E are made to be different from each other, the arrangement positions of the first to fifth stacking connectors 13A to 13E on the respective printed wiring boards 12A to 12F are not changed. Therefore, it is not necessary to provide an additional space for arranging the first to fifth stacking connectors 13A to 13E on the respective printed wiring boards 12A to 12F. As a result, it is possible to prevent the first to sixth printed wiring boards 12A to 12F from being assembled in an incorrect order, without increasing the size of the card holder 11.

Further the first to fifth stacking connectors 13A to 13E are arranged at the second positions 56 in the vicinity of the perimeters of the first to sixth printed wiring boards 12A to 12F. Therefore, the first to fifth stacking connectors 13A to 13E are easily recognizable. As a result, the connecting work is facilitated and working efficiency is improved. In addition, it is possible to carry out the assembling work while checking the variation in the widths W1 to W5 of the first to fifth stacking connectors 13A to 13E.

While the first to fifth stacking connectors 13A to 13E are provided such that the widths W1 to W5 thereof are reduced sequentially in this order in the embodiment described above, the first to fifth stacking connectors 13A to 13E may have different structural configurations in other ways to specify the connectable pair of printed wiring boards, respectively. With a view to improving efficiency of assembling work, it is advantageous to sequentially change the outer appearances of the first to fifth stacking connectors 13A to 13E so as to easily identify the assembling order of the first to sixth printed wiring boards 12A to 12F. In addition, numbers indicating the assembly order of the first to sixth printed wiring boards 12A to 12F may be marked on the surfaces of the first to sixth printed wiring boards 12A to 12F in order to more reliably prevent the first to sixth printed wiring boards 12A to 12F from being assembled in incorrect order.

The invention is not limited to the foregoing embodiments but various changes and modifications of its components may be made without departing from the scope of the present invention. Also, the components disclosed in the embodiments may be assembled in any combination for embodying the present invention. For example, some of the components may be omitted from all the components disclosed in the embodiments. Further, components in different embodiments may be appropriately combined.

What is claimed is:

1. A broadcast receiving apparatus comprising:
a first printed wiring board;
a second printed wiring board stacked on the first printed wiring board;
a third printed wiring board stacked on the second printed wiring board on an opposite side of the first printed wiring board;
a fourth printed wiring board stacked on the third printed wiring board on an opposite side of the second printed wiring board,
a first connector having a first side surface extending between the first printed wiring board and the second printed wiring board, the first connector electrically connecting the first printed wiring board and the second printed wiring board;
a second connector having a second side surface extending between the second printed wiring board and the third printed wiring board, wherein a shape of the second side surface is different from that of the first side surface the second connector electrically connecting the second printed wiring board and the third printed wiring board; and
a third connector having a third side surface extending between the third printed wiring board and the fourth printed wiring board, wherein a shape of the third side surface is different from those of the first and second side surfaces, the third connector electrically connecting the third printed wiring board and the fourth printed wiring board.

2. The broadcast receiving apparatus of claim 1, wherein the first to third connectors are provided such that widths of the first to third side surfaces are increased in an order of the first to third connectors.

3. The broadcast receiving apparatus of claim 1, wherein each of the first to fourth printed wiring boards comprises a card connector, wherein a card is inserted into and ejected from the card connector, and
a type of the card inserted into and ejected from the card connector is varied depending on the card connector.

4. The broadcast receiving apparatus of claim 3, wherein the card stores key information adapted to decode broadcast wave.

5. The broadcast receiving apparatus of claim 4, further comprising a tuner which receives the broadcast wave.

* * * * *